(12) United States Patent
Godfrey

(10) Patent No.: US 11,125,637 B2
(45) Date of Patent: Sep. 21, 2021

(54) DISTRIBUTED PRESSURE SENSING

(71) Applicant: OPTASENSE HOLDINGS LIMITED, Farnborough (GB)

(72) Inventor: Alastair Godfrey, Farnborough (GB)

(73) Assignee: OPTASENSE HOLDINGS LIMITED, Hampshire (GB)

( * ) Notice: Subject to any disclaimer, the term of this patent is extended or adjusted under 35 U.S.C. 154(b) by 0 days.

(21) Appl. No.: 16/624,406

(22) PCT Filed: May 31, 2018

(86) PCT No.: PCT/GB2018/051477
§ 371 (c)(1),
(2) Date: Dec. 19, 2019

(87) PCT Pub. No.: WO2018/234742
PCT Pub. Date: Dec. 27, 2018

(65) Prior Publication Data
US 2020/0124489 A1 Apr. 23, 2020

(30) Foreign Application Priority Data
Jun. 19, 2017 (GB) ..................................... 1709755

(51) Int. Cl.
*G01L 11/02* (2006.01)
*G01D 5/353* (2006.01)
(Continued)

(52) U.S. Cl.
CPC .......... *G01L 11/025* (2013.01); *G01D 5/3537* (2013.01); *G01D 5/35361* (2013.01); *G02B 6/4415* (2013.01); *G02B 2006/12138* (2013.01)

(58) Field of Classification Search
CPC ........ G02B 2006/12138; G01L 11/025; G01L 11/04
See application file for complete search history.

(56) References Cited

U.S. PATENT DOCUMENTS

2013/0291643 A1  11/2013  Lumens
2015/0128706 A1   5/2015  Godfrey

FOREIGN PATENT DOCUMENTS

GB    2522061    7/2015
WO    02/46712   6/2002
(Continued)

*Primary Examiner* — Charlie Y Peng
(74) *Attorney, Agent, or Firm* — McDonnell Boehnen Hulbert & Berghoff LLP

(57) ABSTRACT

This application relates to methods and apparatus for distributed fibre optic sensing that can provide an indication of the absolute value of pressure acting on a sensing portion of a fibre optic cable. A sensor apparatus (600) has a first fibre optic cable structure (102) comprising a first optical fibre (101) and an interrogator (103) configured to perform distributed acoustic sensing on the first optical fibre (101) to provide a measurement signal from at least one sensing portion of the first optical fibre. The first fibre optic cable structure (102) is configured such that a sensitivity of a sensing portion (603, 604) to an incident pressure stimulus (ΔP1, ΔP2) depends on the ambient pressure (AP1, AP2) at the location of the respective sensing portion. A processor (104) is configured to process the measurement signal in response to an incident pressure stimulus (ΔP1, ΔP2) based on a predetermined sensitivity profile (504, 701) to determine an indication of the ambient pressure at the respective sensing portion.

20 Claims, 4 Drawing Sheets

(51) Int. Cl.
  *G02B 6/44*    (2006.01)
  *G02B 6/12*    (2006.01)

(56)    References Cited

FOREIGN PATENT DOCUMENTS

| WO | WO-2014207477 A1 * | 12/2014 | ............ G01H 9/004 |
| WO | 2015/106887 | 7/2015 | |
| WO | WO-2015107332 A1 * | 7/2015 | ............ G01V 13/00 |
| WO | 2016/020654 | 2/2016 | |
| WO | 2016/055787 | 4/2016 | |

* cited by examiner

DISTRIBUTED PRESSURE SENSING

FIELD OF THE INVENTION

This application relates to methods and apparatus for distributed fibre optic sensing and especially to distributed fibre optic sensing for monitoring pressure and to fibre optic cables that can be used for such sensing.

BACKGROUND OF THE INVENTION

Distributed fibre optic sensing is a known type of sensing where an optical fibre is deployed as a sensing fibre and interrogated with electromagnetic (EM) radiation to provide sensing along its length. One particular type of distributed fibre optic sensor repeatedly interrogates the sensing fibre with coherent EM radiation and monitors for radiation which is Rayleigh backscattered from within the sensing fibre. By analysing the radiation backscattered from within the fibre, the fibre can effectively be divided into a plurality of discrete sensing portions which may be (but do not have to be) contiguous. Within each sensing portion, any disturbances or dynamic changes that result in an effective change of optical path length of that sensing portion of the fibre cause a variation in the properties of the radiation which is backscattered from that portion. This variation can be detected and analysed and used to give a measure of the intensity of disturbance of the fibre at that sensing portion.

Such sensors have been used to detect mechanical disturbances of the sensing fibre, for instance, dynamic strains due to incident pressure waves, such as acoustic waves acting on the sensing fibre. Such sensing is thus commonly referred to as distributed acoustic sensing (DAS). A DAS sensor effectively acts as a linear sensing array of sensing portions of optical fibre that are sensitive to dynamic strains, e.g. incident pressure waves.

As mentioned DAS sensors typically perform repeated interrogations of the sensing fibre, where each interrogation involves transmitting at least one pulse of coherent optical radiation into the optical fibre and detecting the intensity of backscattered light from each of a number of sensing portions of the sensing fibre, also called channels, of the DAS sensor. In one type of DAS sensor the intensity of optical radiation which is Rayleigh backscattered from a given channel, from each of a plurality of separate interrogations of the sensing fibre, is monitored to determine any acoustic stimulus acting on the fibre. In one example each interrogation involves launching a single continuous pulse of coherent interrogating radiation.

As the interrogating radiation propagates within the optical fibre there will be some Rayleigh backscatter from inherent scattering sites within the optical fibre. Such scattering may arise from imperfections etc. within the optical fibre that will inherently be present. The backscatter from a given sensing portion of the sensing fibre will depend on the scatting sites within a given sensing portion. As the interrogating radiation is coherent, the backscatter from various different inherent scattering sites within a given sensing portion of fibre will interfere and thus the intensity of the backscatter from a given sensing portion will depend on the number and also the distribution of such scatting sites. The distribution of inherent scattering sits along the length of the optical fibre will be effectively random and thus the backscatter intensity in response to any given interrogating pulse will exhibit a random variation from one sensing portion to the next. However, in the absence of any environmental stimulus, the backscatter intensity from any given sensing portion should remain the same for each repeated interrogation (provided the characteristics of the interrogating pulse remains the same). An environmental stimulus acting on a sensing portion of the fibre will, however, result in a change in effective optical path length for that portion or section of fibre, for example through stretching/compression of the relevant section of fibre and/or modulation of the refractive index of the optical fibre in that section. A change in effective optical path length effectively disturbs the distribution of the scattering sites within the sensing portion, which will vary the degree of interference and thus result in a change in backscatter intensity. This change in intensity can be detected and used as an indication of a disturbance acting on the fibre, such as an incident acoustic wave.

In another type of DAS sensor the backscatter signal is processed to determine a phase change. In one example each interrogation involves launching two pulses of coherent radiation of differing optical frequencies into the fibre so that both pulses propagate in the fibre at the same time. This means that the Rayleigh backscatter received at the detector at any time will comprise backscatter arising from each of the pulses. The backscatter from one pulse will interfere with backscatter from the other pulse, and thus there will be a signal component at the frequency difference between the pulses. If the two pulses are temporally separated, so that in the optical fibre the two pulses are spatially separated, then any change in optical path length occurring at a part of the fibre located between the two pulses would affect the backscatter from one pulse but not the other. This will produce a phase change in the signal at the difference frequency between the pulse frequencies, which can be thought of as a signal at a carrier frequency. By an appropriate choice of carrier frequency and processing of the detected backscatter signal, this phase change can be related to the amplitude of the disturbance acting on the fibre. Again the characteristics of the interrogating radiation, i.e. the frequencies and durations of the two pulses, would typically be the same for each interrogation. Such a phase based DAS system can provide an indication of the actual amount of phase shift caused by an incident stimulus and thus provide a quantitative measure of amplitude of any disturbance.

DAS sensors of the type described above have been usefully proposed for a number of applications such as monitoring of perimeters or borders or linear assets, such as pipelines or the like, for intruder detection or tampering. For many such applications a DAS sensor using a conventional optical fibre is sufficiently sensitive to detect the events of interest.

Such a Rayleigh based distributed fibre optic sensor can, as mentioned, be usefully employed to monitor for dynamic variations in the environment of the sensing fibre, e.g. dynamic strains due to pressure changes. In the field of pressure sensing a Rayleigh based distributed fibre optic sensor may thus be employed to determine information about any changes in pressure.

In some embodiments however it would be desirable to be able to determine information about the absolute pressure.

SUMMARY OF THE INVENTION

Embodiments of the present disclosure relates to methods and apparatus for distributed fibre optic sensing that offer improved pressure sensing capability.

Thus according to an embodiment of the present invention there is provided a distributed fibre optic sensor apparatus comprising:

a first fibre optic cable structure comprising a first optical fibre;

an interrogator configured to perform distributed acoustic sensing on the first optical fibre to provide a measurement signal from at least one sensing portion of the first optical fibre; and a processor;

wherein the first fibre optic cable structure is configured such that, for said at least one sensing portion of the first optical fibre, a sensitivity of the sensing portion to an incident pressure stimulus depends on the ambient pressure acting on first fibre optic cable structure at the location of the respective sensing portion; and wherein the processor is configured to process the measurement signal from said at least one sensing portion of the first optical fibre in response to an incident pressure stimulus based on a predetermined sensitivity profile to determine an indication of the ambient pressure at the respective sensing portion.

In some embodiments, the processor may be configured to process the measurement signal from said at least one sensing portion of the first optical fibre in response to an incident pressure stimulus which is a controlled stimulus of known magnitude. In which case the predetermined sensitivity profile may be an indication of the sensitivity of the respective sensing portion at one or more values of ambient pressure.

In some embodiments the apparatus may further comprise a second optical fibre deployed along the path of the first optical fibre. The interrogator may be configured to perform distributed acoustic sensing on the second optical fibre to provide a measurement signal from at least one sensing portion of the second optical fibre so that at least one sensing portion of the first optical fibre has a corresponding sensing portion of the second optical fibre at substantially the same location. The second optical fibre may be configured such that a sensitivity of the second optical fibre to an incident pressure stimulus has a relationship with ambient pressure that is different to that of the first sensing fibre. The processor may be configured to process the measurement signal from a sensing portion of the first sensing optical fibre together with the measurement signal from the corresponding sensing portion of the second sensing optical fibre in response to the same incident pressure stimulus. In some embodiments the second optical fibre is configured such that the sensitivity of the second sensing optical fibre does not substantially vary with ambient pressure.

The predetermined sensitivity profile may be an indication of the relative sensitivity of the first and second sensing fibres to an input stimulus at one or more values of ambient pressure.

The processor may be configured to determine a ratio of magnitude of the measurement signal from a sensing portion of the first sensing fibre and the measurement signal from a corresponding sensing portion of the second sensing fibre.

In some embodiments the processor may be configured to receive an indication of temperature at one or more locations along the length of the first fibre optical cable structure. The predetermined sensitivity profile may be indicative as to how sensitivity varies with temperature. In some embodiments the apparatus may comprise a fibre optic distributed temperature sensor configured to perform distributed temperature sensing on a temperature sensing optical fibre deployed along the path of the first fibre optic cable structure.

In some embodiments the first fibre optic cable structure comprises at least one deformable strain transformer mechanically coupled to the first optical fibre and configured such that a force acting on the strain transformer in a direction transverse to the cable axis results in a deformation of the strain transformer thereby applying a longitudinal force to the first optical fibre.

In some implementations a compliant core material may be mechanically coupled to the first optical fibre such that a longitudinal force acting on the compliant core material induces a longitudinal strain in the first optical fibre. In some instances the first optical fibre may be coupled to a buffer material with the buffer material coupled to the compliant core material. In any case the strain transformer may be coupled to the at least one optical fibre via the compliant core material. The force transformer may be stiffer than the compliant core material. In some implementations the compliant core material comprises extruded nylon.

In some embodiments the strain transformer comprises a braid member. In some embodiments the strain transformer comprises at least one helically coiled member. The helically coiled member may be coiled around the compliant core member. The helix angle of the helically coiled member may be greater than 5 degrees and may be of the order of 50 to 70 degrees. The diameter of the helically coiled member may be in the range of 1 to 10 mm.

In some arrangements at least one portion of the first fibre optic cable structure may comprise a plurality of strain transformers, each strain transformer comprising a helically wound coiled member. At least one helically wound coiled member may be wound in the opposite direction to another helically wound coiled member and/or at least one helically wound coiled member may be interleaved with another helically wound coiled member.

The strain transformer may comprise a metallic material, and may for instance comprise a shaped steel member. In some examples the volume percentage of steel of the fibre optic cable may be substantially 10%.

The first fibre optic cable structure may comprise a first jacket layer wherein the first optical fibre, and the at least one strain transformer are disposed within the first jacket layer. In some implementations at least part of the strain transformer may be coupled to the first jacket layer.

In some applications at least part of the first fibre optic cable structure may be deployed, in use, within a fluid filled conduit and the processor may be configured to determine an indication of the pressure of the fluid within the conduit. In some applications at least part of the first fibre optic cable structure maybe deployed within a wellbore and the processor may be configured to determine an indication of the pressure of the fluid within the wellbore.

In another aspect there is provided a method of distributed fibre optic sensing comprising:

performing distributed acoustic sensing on a first optical fibre disposed within a first fibre optic cable structure to provide a measurement signal from at least one sensing portion of the first optical fibre;

wherein the first fibre optic cable structure is configured such that, for said at least one sensing portion of the first optical fibre, a sensitivity of the sensing portion to an incident pressure stimulus depends on the ambient pressure acting on first fibre optic cable structure at the location of the respective sensing portion;

the method comprising acquiring a measurement signal from at least one sensing portion of the first optical fibre in response to an incident pressure stimulus; and processing said measurement signal based on a predetermined sensitivity profile to determine an indication of the ambient pressure at the respective sensing portion.

The method may be implemented in any of the variants discussed above in relation to the apparatus.

Aspects also related to determining a sensitivity profile for a distributed fibre optic cable structure where the first fibre optic cable structure is configured such that, for said at least one sensing portion of the first optical fibre, a sensitivity of the sensing portion to an incident pressure stimulus depends on the ambient pressure acting on first fibre optic cable structure at the location of the respective sensing portion. The method of determining a sensitivity profile may include modelling and/or calibrating the response of a sensing portion.

DESCRIPTION OF THE DRAWINGS

Embodiments of the disclosure will now be described, by way of example only, with respect to the accompanying drawings, of which.

DESCRIPTION OF THE INVENTION

Embodiments of the present disclosure relate to methods and apparatus for distributed fibre optic sensing that can provide an indication of absolute pressure, e.g. an indication of the absolute value of pressure at a sensing portion of a sensing fibre of a distributed fibre optic sensor. Embodiments relate to a distributed fibre optic sensor capable of determining absolute pressure and to various components of such a sensor, such as suitable interrogator unit and/or a suitable sensing fibre optic cable structure as well as to methods of sensing.

Figure 1:
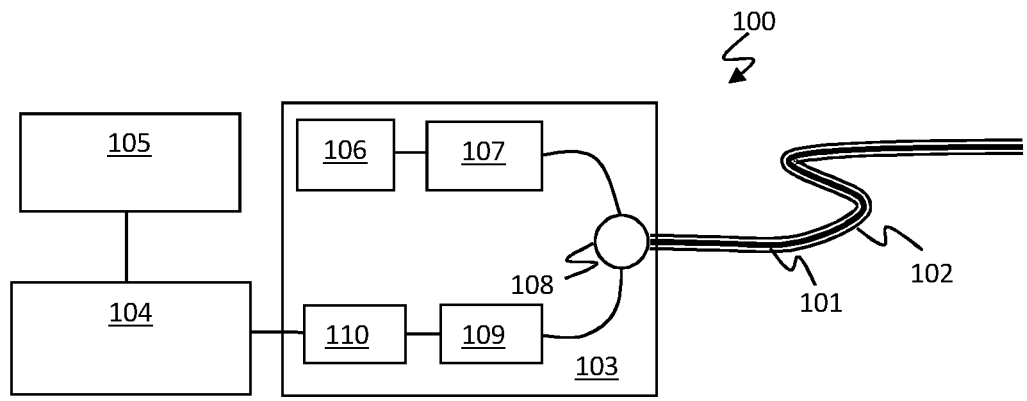
FIG. 1 illustrates a fibre optic distributed sensor apparatus.

FIG. 1 shows a schematic of a distributed fibre optic sensing arrangement 100. An optical fibre 101 from one end of a fibre optic cable structure 102 is removably connected an interrogator 103 to act as a sensing fibre. The output from interrogator 103 may, in some instance be passed to a signal processor 104, which may be co-located with the interrogator 103 or may be remote therefrom, and/or a user interface/graphical display 105, which in practice may be realised by an appropriately specified PC. The user interface may be co-located with the signal processor 103, if present, or may be remote therefrom.

The sensing fibre 101 (and the fibre optic cable 102) can be many kilometres in length and may, in some applications, be tens of kilometres in length. For conventional distributed fibre optic sensing, such as distributed acoustic sensing (DAS), the sensing fibre 101 may be a standard, unmodified single mode optic fibre such as is routinely used in telecommunications applications without the need for deliberately introduced reflection sites such a fibre Bragg grating or the like. The fibre will typically be housed within fibre optic cable structure 102 which may contain more than one optical fibre.

When used for sensing, the fibre optic cable 102, comprising the sensing fibre 101, will have been deployed in an area of interest to be monitored. In operation the interrogator 103 launches interrogating electromagnetic radiation, which may for example comprise a series of optical pulses having a selected frequency pattern or some coding, into the sensing fibre. The optical pulses may have a frequency pattern as described in GB patent publication GB2,442,745 or optical characteristics such as described in WO2012/137022, the contents of which are hereby incorporated by reference thereto, although distributed fibre optic sensors relying on a single interrogating pulse are also known and may be used. Alternatively the interrogator could launch an integration comprising a coded sequence of optical radiation as described in WO2017/037453.

Note that as used herein the term "optical" is not restricted to the visible spectrum and optical radiation includes infrared radiation and ultraviolet radiation and references to "light" shall be construed in the same way. As described in GB2,442,745, WO2012/137022 or WO2017/037453, and as will be understood by one skilled in the art, the phenomenon of Rayleigh backscattering results in some fraction of the optical radiation which is input into the sensing fibre 101 being reflected back to the interrogator, where it is detected and processed to provide an output measurement signal which is representative of disturbances of the fibre that cause a change in effective optical path length. The interrogator 103 typically therefore comprises at least one coherent optical source 106, such as a laser, and at least one optical modulator 107 for modulating the output of optical source 106 to provide the desired optical interrogating radiation which is output to the optical fibre 101, e.g. via circulator 108. The optical modulator 107 may, for instance, modulate the output of the source 106 to provide a plurality of optical pulses separated by a known optical frequency difference or alternatively a coded optical sequence, as would be understood by one skilled in the art. The interrogator 103 also comprises at least one photodetector 109 arranged to detect radiation which is Rayleigh backscattered from within the fibre 101 and received back at the proximal end of the sensing fibre 101, e.g. via circulator 108. For a distributed fibre optic sensor the photodetector 109 is configured to detect optical radiation which is Rayleigh backscattered from intrinsic scattering sites within the optical fibre 101.

An output signal from the photodetector 109 may be received and processed by an interrogator processor 110, which may demodulate the detected backscatter signal in an appropriate way given the form of the interrogating radiation, for instance based on the frequency difference between the optical pulses or by correlating with a relevant coded sequence. The integrator processor 110 may process the detected backscatter for example as described in any of GB2,442,745, WO2012/137021, WO2012/137022 or WO2017/037453. The processor 110 may also apply a phase unwrap algorithm. The phase of the backscattered light from various sections of the optical fibre can therefore be monitored. As described previously any changes in the effective optical path length within a given section of fibre can therefore be detected.

The form of the optical input and the method of detection allow a single continuous fibre to be spatially resolved into discrete longitudinal sensing portions or channels. That is, a measurement signal from one sensing portion (or channel) can be provided substantially independently of the measurement signal from an adjacent sensing portion.

The processor 110 may thus determine, for each sensing portion of the optical fibre, a measurement signal indicative of the variations in effective optical path length of the sensing portion.

As mentioned this type of sensor can be used for distributed acoustic sensing (DAS) where the measurement signal determined for each sensing portion can be indicative of any dynamic changes in effective optical path length due to dynamic strains, for instance such as caused by incident pressure waves.

Embodiments of the present disclosure may use an interrogator 103 that may be suitable for distributed acoustic sensing. Note that the term "acoustic" shall be taken to refer to any type of pressure wave or mechanical disturbance or varying strain generated on the optical fibre, at any frequency, and for the avoidance of doubt the term acoustic will be used in the specification to include seismic signals and waves or other types of vibration. As used in this specification the term "distributed acoustic sensing" will be taken to mean sensing by optically interrogating an optical fibre to provide a plurality of discrete sensing portions distributed longitudinally along the fibre that are sensitive to variations in effective optical path length and the term "distributed acoustic sensor" shall be interpreted accordingly.

Such a sensor may be seen as a fully distributed or intrinsic sensor, as it makes use of the intrinsic scattering processes that are inherent in an optical fibre and, as such, can distribute the sensing function throughout the whole of the optical fibre.

As mentioned above such DAS sensors have been usefully employed, using conventional fibre optic cables, in a variety of applications for monitoring for dynamic strains, e.g. such as dynamic strains caused by relatively rapid pressure changes. Conventional DAS however is not suitable for determining any reliable indication of absolute pressure at a location.

In embodiments of the present disclosure the fibre optic cable structure 102 is configured such that, along at least part of its length, the application of a given stimulus to the fibre optic cable structure will result in a change in effective optical path length for an optical fibre within the fibre optic cable structure, where the extent of the change in effective optical path length to the given stimulus depends on the ambient pressure acting on the sensing portion. In other words if a pressure wave or pressure variation of a defined amplitude is applied to the fibre optic cable structure, the resulting change in effective optical path length for a sensing optical fibre within the fibre optic cable structure will depend on the absolute value of the ambient pressure acting on the sensing portion. In embodiments the longitudinal strain applied to the sensing fibre in response to a given input stimulus thus depends on the ambient pressure.

The measurement signal produced for a sensing portion of a distributed fibre optic sensor of the type described above in relation to FIG. 1 depends on the extent of optical path length change experienced by the relevant sensing portion, i.e. the magnitude of the variation in measurement signal depends on the magnitude of the corresponding change in effective optical path length for that sensing portion. Thus, implementing a distributed fibre optic sensor using a fibre optic cable structure 102 where, for at least some sensing portions, the change in effective optical path is dependent on the ambient pressure, means that the sensitivity to dynamic pressure variations of the distributed fibre optic sensor varies with pressure. That is, the sensitivity of a given sensing portion, in terms of the variation in measurement signal from that sensing portion to a given stimulus, will vary if the ambient pressure at that sensing location varies.

In embodiments of the disclosure the sensitivity of at least one sensing portion of a DAS sensor to an incident pressure stimulus, e.g. acoustic wave, is thus dependent on the absolute value of the ambient pressure acting on that sensing portion, i.e. the sensitivity varies with absolute pressure. This variation in sensitivity with absolute pressure may be characterised, for at least one sensing portion, to provide a sensitivity profile. The sensitivity profile can thus provide an indication of how the sensitivity of that sensing portion is known or expected to vary with absolute pressure.

Methods and apparatus of the present disclosure may use such a sensitivity profile to determine the absolute pressure acting on the cable structure by determining the response of a sensing portion to a known stimulus. For example, if a stimulus is applied to the fibre optic cable structure at the position of the relevant sensing portion and information about the magnitude of the stimulus is known, the resultant measurement signal from that sensing portion can be analysed to determine a sensitivity value for the sensing portion. Based on the sensitivity profile an indication of the ambient pressure acting on the fibre optic cable at that sensing portion can thus be determined.

As will be described in more detail below information about the magnitude of a stimulus acting on the fibre optic cable structure may be determined in a number of ways. In some embodiments a known stimulus may be applied to the cable structure. Additionally or alternatively in some embodiments DAS may be performed on a first fibre within a fibre optic cable structure that exhibits and a sensitivity variation with pressure as described and also on a second sensing fibre with a different sensitivity profile, for instance a second sensing fibre which exhibits no variation in sensitivity with absolute pressure. The response from the second sensing fibre may be used to determine an indication of the stimulus applied to the cable structure housing the second sensing fibre.

Embodiments thus make use of a fibre optic cable structure 102 which is configured such that a change in effective optical path length (for a sensing optical fibre within the fibre optic cable structure 102), in response to a dynamic pressure stimulus, varies with ambient pressure. The fibre optic cable structure comprises at least one optical fibre that can be used as a sensing fibre and may comprise at least one strain transformer, mechanically coupled to the optical fibre, which is configured to transform a radial or transverse strain acting on the fibre optic cable structure into a longitudinal strain on the optical fibre. The strain transformer is configured to transform a radial strain on the cable 102 into a longitudinal strain on the fibre 101, such that a compressive force on the outside of the cable, e.g. a pressure pulse, is transformed into a longitudinal force acting on the optical fibre.

Figure 2:
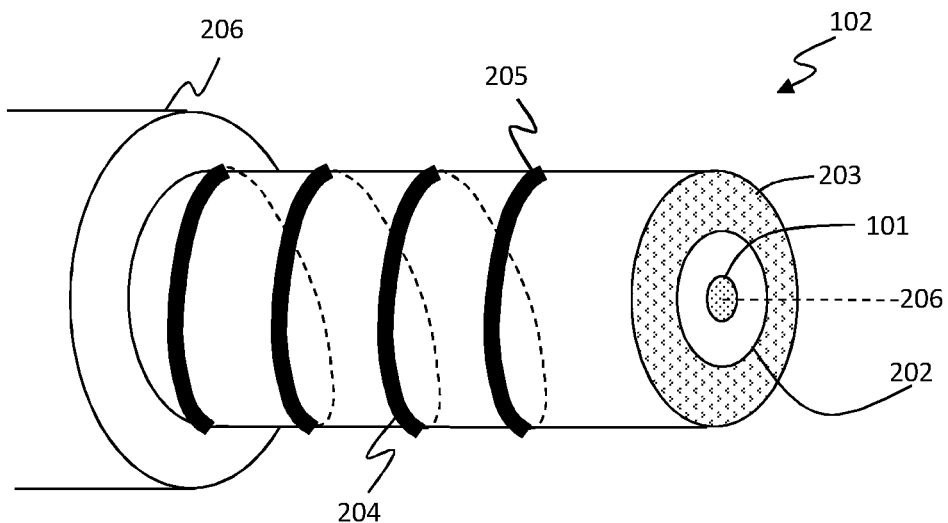
FIG. 2 illustrates an example of a fibre optic cable structure suitable for use in embodiments of the disclosure.

FIG. 2 illustrates a perspective cutaway view of one generic example of a suitable fibre optic cable structure 102. The fibre optic cable structure 102 comprises at least one optical fibre 101 that runs generally along the length of the cable structure 102 and which may be used as a sensing fibre for a fibre optical distributed sensor. Only one optical fibre 101 is illustrated in FIG. 2 for clarity but it will be appreciated that the fibre optic cable could comprise a plurality of optical fibres. Each optical fibre 101 may comprise a core and cladding, and possibly one or more jacket layers (not separately illustrated) as would be understood by one skilled in the art.

The optical fibre(s) 101 may be coupled to a tight buffer material 202 which may itself be coupled to a compliant core material 203. The coupling between the optical fibre 101 and the compliant core material 203 is such that a dynamic longitudinal strain applied to the compliant core material will induce a longitudinal strain in the optical fibre. In other words a strain applied to the compliant core material 203 will be transferred to the optical fibre 101 and a longitudinal displacement of the compliant core material 203 will result in a longitudinal displacement of any buffer material 202 and correspondingly the optical fibre 101. Thus, in some implementations, the optical fibre 101 may be arranged so that it will not slide significantly with respect to the core material 203 or buffer 202, at least for dynamic strains resulting from pressure waves of the frequencies of interest for DAS. In some embodiments the material 203 of the compliant core may also act as the buffer material 202, i.e. a separate buffer material 202 may not be required. It will also be understood that the compliant core material 203 and/or buffer material 202 could, in some arrangements comprise multiple layers.

In some implementations the buffer material 202 may be a gel or gel-like material. Various gel buffers are known for fibre optic cables. A relatively sudden longitudinal movement of the compliant core material 203 will cause a longitudinal movement in a gel buffer material which will be transmitted to the embedded optical fibre 101. Thus a gel buffer can provide the coupling described above. However, if the fibre optic cable is subject to relatively large and slow, i.e. low frequency strains, such as may be experienced during installation or handling of the fibre optic cable for instance, a gel buffer material may relax the strain experienced by the optical fibre. Thus use of a gel buffer material may help reduce the risk of damage during installation and handling whilst still providing good coupling at the frequencies of interest. Gel buffered fibre optic cables based on a conventional design, i.e. without a force transformer, have been used previously as DAS sensing fibres and have performed well for incident longitudinal waves, showing good coupling between the fibre, gel buffer and outer cable layers at acoustic frequencies of interest.

Mechanically coupled to the compliant core material 203 is at least one strain transformer 204, which in the example of FIG. 2 comprises a coiled member 205 wound around the compliant core material 203. The coiled member 205 may be coupled to the compliant core material 203 to effectively grip the compliant core material 203 so that the compliant core material 203 moves with the coiled member 205. In some embodiments however the coiled member 205 may additionally or alternatively be anchored to the compliant core material 203 at various anchor points and/or at least part of the coiled member 205 may be embedded within the compliant core material 203. The coiled member 205 in this example is coiled around the longitudinal cable axis 206 in a generally helical fashion and is surrounded by at least one cable jacket material 207.

Figure 3:
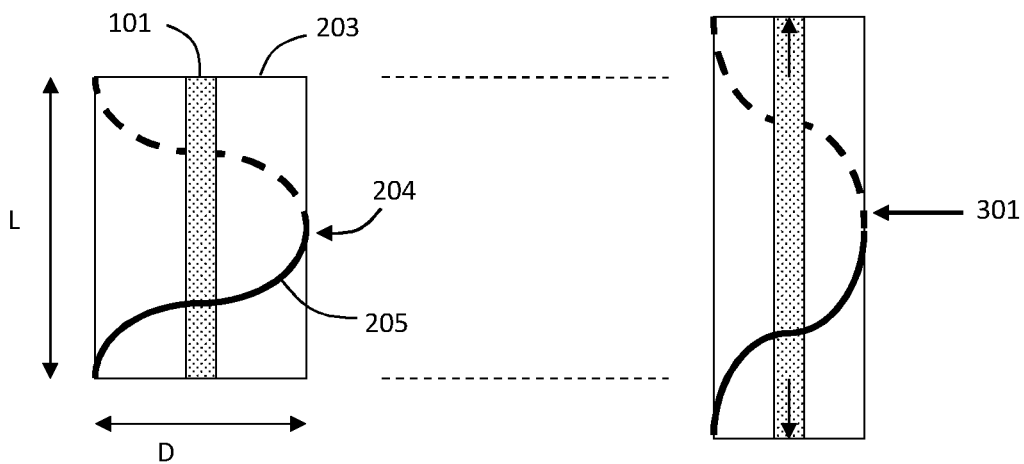
FIG. 3 illustrates the principles of operation of the strain transformer.

The coiled member 205 of the strain transformer 204 has a relative stiffness, compared to the compliant core material 203, and the buffer material 202 if present, which means that the strain transformer 204 is deformable and, due to the helical winding of the coiled member 205, deformation of the strain transformer 204 results in a radial or diametrical change which translates into a longitudinal length change, as illustrated in FIG. 3.

FIG. 3 illustrates a portion of the fibre optic cable structure with one complete winding of coiled helical member 205. FIG. 3 illustrates the path of the coiled member 205 as viewed from a direction which is perpendicular to the longitudinal cable axis, i.e. a transverse direction. It can be seen that from such a view the coiled member 205 has a shape that is convex with respect to the cable longitudinal axis, i.e. has a shape that bulges or curves outwards from the cable axis in a transverse direction. It will, of course, be understood that if the coiled member 205 is coiled around the cable axis then the radial distance from the cable axis may be substantially constant. However when viewed from a given (fixed) transverse direction the path of the coiled member 205 (or at least the projection of the path in a plane parallel to the cable axis) has a generally meandering or serpentine path with respect to the cable axis which defines a convex shape. In yet other words the shape of the strain transformer 204 is such that the distance of the strain transformer from the cable axis in a first (fixed) transverse direction (e.g. x-axis component of distance) varies along the cable axis (e.g. the z-axis). This means that a transverse force 301 applied to the coiled member 205 is at least partly transformed into a longitudinal force which results in a change in the longitudinal length of the strain transformer.

The left hand side of FIG. 3 illustrates the section of cable in the absence of an external force. This portion of the strain transformer 204, corresponding to a single winding of coiled member 205, thus has a resting length, L, equal to the pitch of the coil or helical winding and a resting diameter, D. The right hand side of FIG. 3 illustrates the situation with a transverse force 301 applied, such as may be applied by a pressure wave propagating transversely to the cable axis. The transverse force 301 results in a deformation of the strain transformer 204 in the radial direction which translates to a deformation in the longitudinal direction and thus a change in longitudinal length of this portion of the coiled member 205. The strain transformer thus responds to a transverse force to induce a longitudinal strain in the compliant core material 203 and hence the optical fibre 101.

Figure 4:
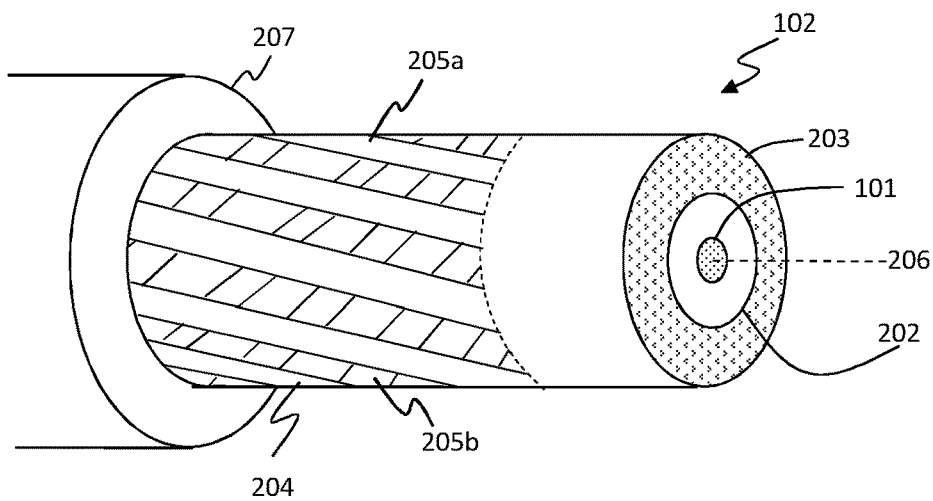
FIG. 4 illustrates another example of a fibre optic cable structure suitable for use in embodiments of the disclosure

FIG. 2 illustrates that the strain transformer 204 may be implemented by a continuous coiled member 205. FIG. 4 illustrates another example of a suitable fibre optic cable structure 102 that could be used in embodiments of the present disclosure in which similar components are identified by similar reference numerals. In the example of FIG. 4 the strain transformer 204 comprises a braid structure in which coiled members 205a and 205b, which may comprise strips of material, are wound in different directions around the core material 203 to provide the braid structure. The principle of operation of the strain transformer 204 illustrated in FIG. 4 is the same as discussed with respect to FIGS. 2 and 3. A compressive transverse force applied to the braid structure 204 will tend to cause a longitudinal elongation of the braid structure.

One skilled in the art will of course appreciate that there are a variety of fibre optic cable designs and in other designs there may be one or more armour layers. In some designs there may be a strength member such as a metallic rod or wire running along the path of the cable axis. There additionally may be more buffer and/or jacket layers.

The cable should ideally be stiff enough to install without too much stretch. In some embodiments the compliant core material may not be a continuous homogenous material but may have cavities or other internal features so that the bulk stiffness can be tailored for the relevant application and the thermal expansion coefficient of the fibre optic cable. For example the compliant core material could be an extruded shape with holes and/or spokes. The core material should also be rigid enough not to collapse too much under any steady state pressure of the surrounding medium when deployed.

The helix angle of the strain transformer should be arranged to provide a desired mechanical advantage for the strain transformer. The closer the helix angle gets to 90 degrees, the greater the longitudinal stiffness will be. In some embodiments the helix angle may be greater than about 5 degrees. In one embodiment the helix angle may be of the order of substantially 60 degrees, say in the range of 50-70 degrees. Note that as used herein the term helix angle refers to the angle that the helical structure makes to a circumferential line.

The diameter of the strain transformer may be relatively low, thus permitting the overall diameter of the cable structure to be relatively low. For example the diameter of the strain transformer may be of the order of 5 to 10 mm. In some instances the overall diameter of the cable may be of the order of 6 to 10 mm. If required however smaller diameter cables could be constructed using smaller diameter strain transformers and smaller diameter compliant cores, for instance a cable diameter of down to about 1 mm has been fabricated. In some applications however (e.g. for hydrophones), a larger diameter cable structure may be advantageous and it may be wished to use a larger diameter strain transformer structure.

The braid structure of the strain transformer 204 may conveniently comprise a metallic material, for example steel. As mentioned the braid could be stiffer than the compliant core and optical fibre and yet still be deformable to transverse forces due to temperature variations. Steel can provide the required properties and can be worked to form a coiled structure relatively easily during cable manufacture. Stainless steel is stiff, corrosion resistant, readily available and reasonably cheap and has already been used in cable manufacture for different reasons. However other materials such as glass fibre or carbon fibre could potentially be used in some cable designs and possibly superelastic materials such as Nitinol. In some embodiments the braid member may be formed from an alloy comprising materials with different properties. The materials and their proportions may be chosen to tailor the overall response of the strain transformer, for instance to tailor the range of pressure for which the cable exhibits a high variation in sensitivity with ambient pressure variations.

The compliant core material should be suitably compliant so as to move with the strain transformer 204 but should also be suitable for transferring an induced strain to the optical fibre or buffer material. One suitable compliant core material may be extruded nylon which is used in some fibre optic cable construction already. As mentioned above the compliant core material should be have sufficient stiffness for the required application and may in some instance have a non-homogeneous structure. In some embodiments for instance a closed cell foam material could be used and for example the pore fraction could be controlled to tune the stiffness for the required application. Other polymer materials could also be used.

In practice the various material properties may be chosen for a particular application and/or for compatibility of with other components of the cable structure. As discussed above the strain transformer 204 may, in some instances, be formed, at least partly, from steel. Steel has a much higher stiffness than the conventional polymers used for the fibre optic cable, and is typically approximately 100 times stiffer than such conventional polymers. This means that a relatively small proportion of steel would be required to be the dominant stiffness in the cable structure, depending on the form, e.g. the helix angle, of the strain transformer.

It will be understood that optical fibres wound with metallic material have been proposed previously. For instance, metallic braiding has previously been used for armouring in conventional fibre optic cables. In such cables however the braiding has been tightly wound and tightly interwoven and, as such, is not configured to be deformable together with a compliant core so as to translate a radial strain into a longitudinal strain. In conventional fibre optic cables any such braiding is configured to have limited deformation and provides no mechanical advantage and does not function as a strain transformer.

It has previously been recognised that a fibre optic cable structure, incorporating a strain transformer 204 in this way, could be used for DAS sensing and may be advantageous in providing an enhanced sensitivity to transverse disturbances, compared to a conventional fibre optic cable without such a strain transformer. As discussed above a Rayleigh backscatter based DAS sensor detects a change in effective optical path length. For a conventional fibre optic cable, e.g. with a sensing fibre and a tight buffer material, held in a cable jacket, a pressure wave propagating longitudinally with respect to the able will tend to directly stretch or compress the optical fibre and have an impact on optical path length. Acoustic waves of the same magnitude that are incident transversely will have less on an impact on optical path length, and thus a conventional fibre optic cable will be most sensitive to longitudinal stimuli, whereas in some applications the signals of most interest may be incidence as transverse waves. It has been recognised that inclusion of a strain transformer of the type described may transform at least some of the transverse strain into a longitudinal strain acting on the sensing fibre and thus improve the sensitivity to transverse signals.

Surprisingly however it has also been found that a fibre optic cable structure with a strain transformer as illustrated in FIGS. 2 to 4 can provide a sensitivity that varies with absolute pressure acting on the fibre optic cable structure.

Pressure on the outside of a fibre optic cable is transferred into change in effective optical path length of a sensing optical fibre within the cable by two main effects. The first is the physical change in length of the cable, and hence optical fibre, as the surface pressure is changed. The second is by the effect of the pressure on the effective refractive index of the fibre. The principle behind the strain transformer is to use a stiffening structure within the cable to mechanically enhance the way that diametrical strain (i.e. radial or transverse strain) is transferred to longitudinal strain.

The inclusion of the strain transformer can thus provide a controlled increase in the longitudinal strain experienced by the optical fibre in response to a given transverse strain or pressure variation acting on the cable. However, it has been found that the strain response of such a fibre optic cable structure can vary with the absolute pressure acting on the cable.

Figure 5A:
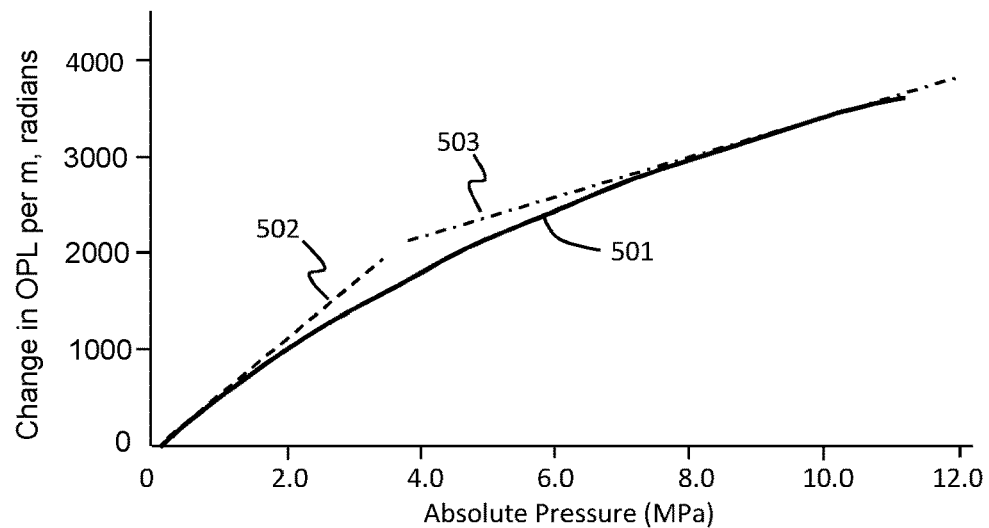
FIGS. 5a and 5b illustrate respectively plots of how optical path length and sensitivity of a sensing fibre of a cable structure such as illustrated in FIG. 4 may vary with pressure.

FIG. 5a illustrates a plot of change in optical path length against pressure for a fibre optic cable structure including a strain transformer, which in this case was a braided structure such as illustrated in FIG. 4. The plot of FIG. 5a was obtained by performing DAS on the optical fibre of cable structure with increasing hydrostatic pressure on the cable structure and determining the resultant change in effective optical path length. A lengthy of the fibre optic cable structure 102 was held in a sealed pressure chamber where the hydrostatic pressure could be varied. In this case a 5 m length of fibre optic cable was located in the pressure chamber and DAS was performed to provide a sensing portion that was greater than 5 m in length and centred on the length of sensing fibre in the pressure chamber. The fibre optical cable was left loose in the pressure chamber to ensure that any changes in length of the pressure chamber itself with increasing pressure did not couple to the sensing fibre. The pressure in the pressure chamber was increased from 0.1 MPa (1 bar) in a series of steps and the measurement signal from the channel recorded after a suitable settling time. After the maximum pressure (nearly 12 MPa—about 110 bar) was reached the same process was repeated in reverse, with the pressure being decreased back to 0.1 MPa in a series of steps and measurements taken a suitable time after each step. The optical path length change for the sensing portion at each pressure was determined for both the increasing pressure sequence and decreasing pressure sequence and divided by 5 to give an indication of the change in optical path length, per metre, in radians. The temperature was also recorded to detect any temperature variation that may influence the optical path length and any necessary temperature compensation was applied to give the results illustrated in FIG. 5a.

It can be seen that optical path length of the sensing portion varies with pressure as illustrated by curve 501. It can be further seen that the gradient of curve 501 varies with pressure and the gradient gradually reduces with increasing pressure. At a value of absolute pressure of about 1 MPa the plot 501 has a first gradient, illustrated as 502. At a higher absolute pressure of 10 MPa the plot 502 has a second, lower, gradient as illustrated by line 503. Thus at relatively lower absolute pressures, a certain pressure variation, i.e. a pressure variation of magnitude $\Delta P$, will result in a greater variation in optical path length for the sensing fibre than would be the case for the same pressure variation $\Delta P$ being applied at a greater absolute pressure. Hence the variation in measurement signal from that sensing portion to the given pressure variation will be lower at higher absolute pressures, i.e. the sensitivity will be lower, than at lower absolute pressures.

Figure 5B:
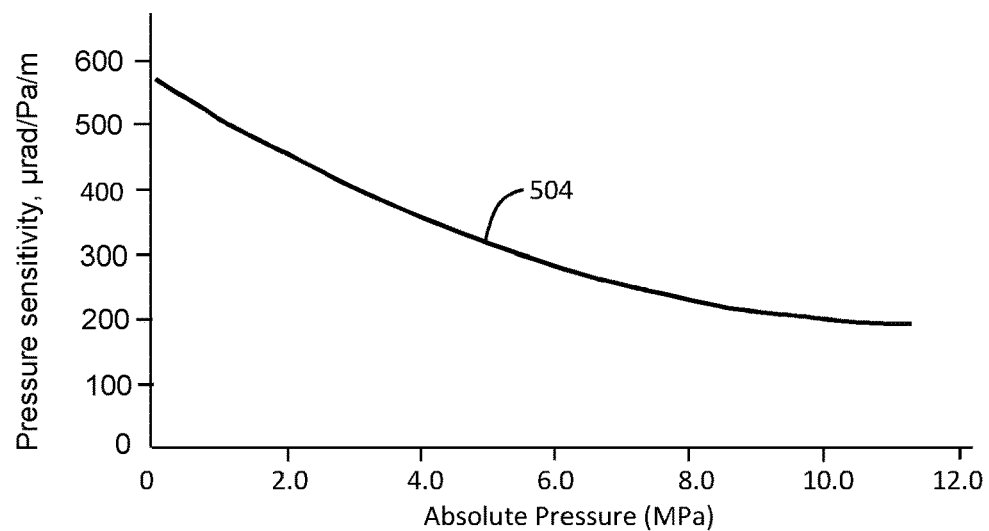

FIG. 5b illustrates a plot 504 of how the sensitivity of the sensing portion will vary with absolute pressure, in terms of microradians per metre of cable per pascal of pressure variation. FIG. 5b illustrates the sensitivity at an absolute pressure of 1 bar (i.e. 0.1 MPa) is of the order of 560 μrad $Pa^{-1}$ $m^{-1}$. FIG. 5b also illustrates the sensitivity at 110 Bar (i.e. 1.1 MPa) is of the order of 200 μrad $Pa^{-1}$ $m^{-1}$. Thus it can be seen that the strain response to a certain pressure variation $\Delta P$ will be about 2.8 times less at a pressure of 1.1 MPa compared to a pressure of 0.1 MPa. Thus if an optical fibre of such a fibre optic cable structure were used as the sensing fibre of a DAS sensor, it would be expected that the sensitivity of the DAS sensor would vary according to the hydrostatic pressure acting on the fibre optic cable structure.

It can be seen that the gradient of the plot 504, and hence the sensitivity of a DAS sensor, varies smoothly over this pressure range. Thus the expected strain variation to a pressure wave of a known magnitude, e.g. $\Delta P$, will depend on the absolute pressure at a given location along the length of the fibre optic cable structure and will vary with absolute pressure.

In embodiments of the present disclosure the sensitivity response of the fibre optic cable structure with pressure, e.g. a plot such as 504, may be characterised as a sensitivity profile. The sensitivity profile indicates, for at least some values of pressure over an operating pressure range of interest, an indication of the expected sensitivity of the fibre optic cable structure (when used for fibre optic distributed sensing), e.g. an indication of the expected measurement signal for a defined pressure variation. This could for instance be an indication of the gradient of a plot of optical path length against pressure for the fibre optic cable structure at a plurality of different values of absolute pressure.

The sensitivity profile may at least partly be based on an expected sensitivity variation for the particular fibre optic cable structure, for instance based on a modelled response and/or previous measurements for other fibre optic cable structure of the same design. In at least some instances however the sensitivity profile may be determined through calibration, for instance in a factory calibration test.

For example a fibre optic cable structure could be connected to a fibre optic interrogator unit and deployed in a controllable pressure chamber. The variation in measurement signal from at least some sensing portions to controlled pressure variations could be determined at each of a plurality of values of absolute pressure to determine a sensitivity profile. The properties of the fibre optic cable should be fairly consistent along the length of the cable, assuming satisfactory manufacturing processes. Therefore a model of the fibre optic cable structure may be sufficient, and/or test results for one cable may be applicable to other cables of the same design. If calibration is used it may be sufficient to calibrate part of the fibre optic cable and use the relevant sensitivity profile for the whole length of the cable.

Once a sensitivity profile for the fibre optic cable structure is known, the sensitivity profile can be used to determine information about the pressure acting on the fibre optic cable structure when used subsequently for distributed fibre optic sensing. The general idea is to perform distributed fibre optic sensing using the fibre optic cable structure and to monitor the response of the sensing portions to incident stimulus. If information about the magnitude of the incident stimuli is known then the present sensitivity of the relevant sensing portion can be determined and hence, based on the sensitivity profile, an indication of the absolute pressure at that sensing portion can be determined.

In other words, if the magnitude of a stimulus, e.g. a pressure wave, acting on the fibre optic cable structure is known, the variation in measurement signal from a sensing portion in response to that stimulus can be determined. This provides an indication of the present sensitivity of the sensing portion to pressure variations and hence, based on the sensitivity profile, an indication of the absolute pressure at that sensing portion.

There are various ways in which the magnitude of a stimulus such a pressure wave may be determined.

In some embodiments, a known stimulus may be applied to part of the fibre optic cable structure. For instance there may be some instances in which part of the fibre optic cable is deployed near a device that can operate to generate a pressure stimulus of a known magnitude. If this is the case then operation of the device may provide the known stimulus. In some instances the device could be a pressure transducer which is deliberately deployed to excite a known stimulus. It will be understood however that whilst the pressure variation of the applied stimulus may be known at the source, if the relevant sensing portion is not co-located with the source of the stimulus, then the stimulus may be attenuated as it travels to the sensing portion of the sensing fibre. If the transfer function for the path between the source and the sensing portion is known or can be modelled then it may be possible to determine the magnitude of the stimulus that will be experienced by the sensing portion. In some instances however this may not be practical.

In some embodiments therefore distributed fibre optic sensing may be performed using a first sensing fibre within a first fibre optic cable structure as discussed above and an indication of magnitude of a stimulus incident on the first fibre optic cable structure may be determined by performing distributed fibre optic sensing on a second optical fibre, where the second optical fibre is arranged so as to have a sensitivity versus absolute pressure relationship that is different to that of the firsts sensing fibre. Advantageously in some embodiments the second optical fibre is arranged so as to provide a sensitivity that does not vary significantly with pressure.

Figure 6:
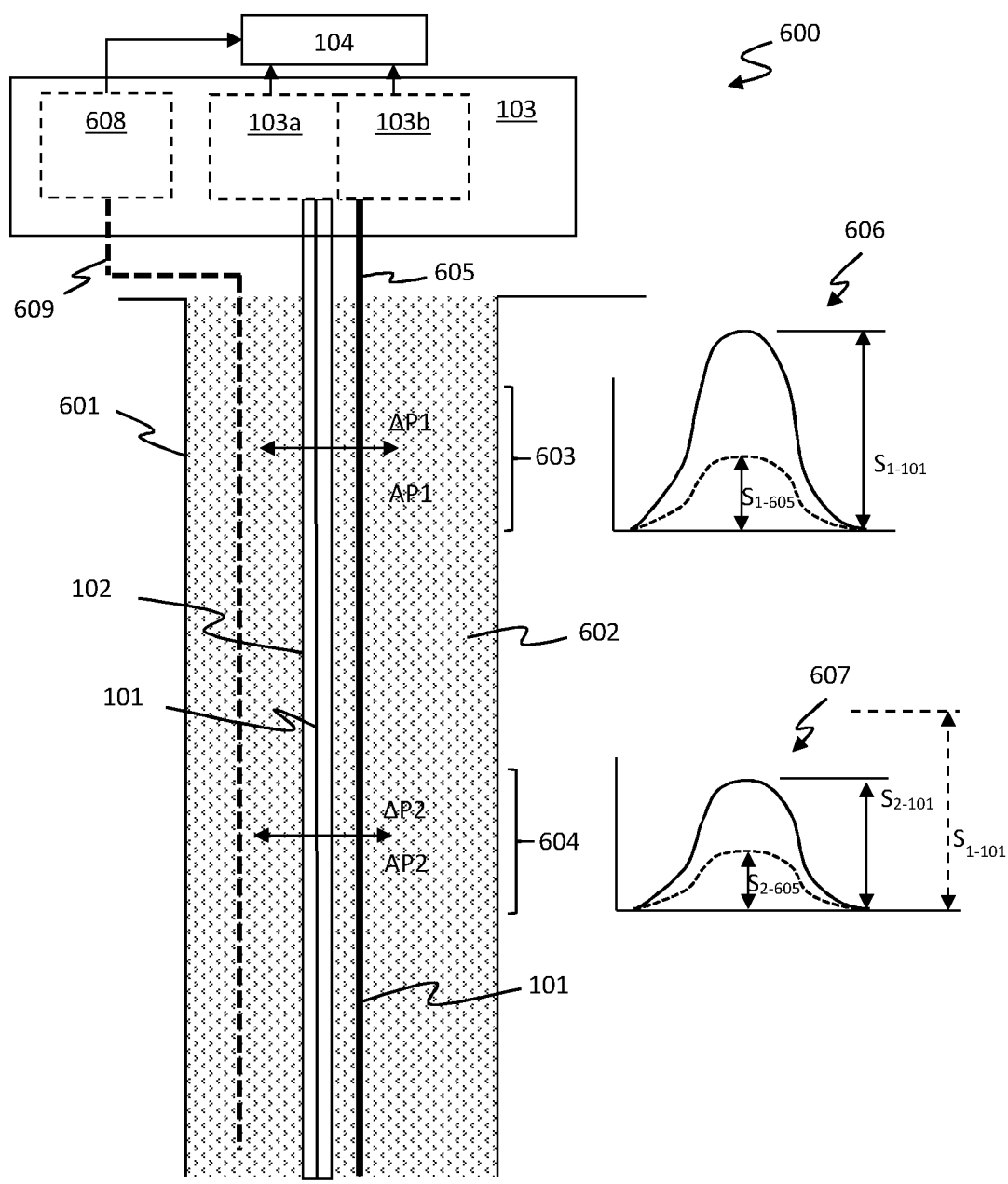
FIG. 6 illustrates a distributed fibre optic sensing apparatus according to an embodiment.

FIG. 6 illustrates a distributed fibre optic sensor apparatus 600 according to an embodiment. FIG. 6 illustrates a first fibre optic cable structure 102 having at least one optical fibre 101 connected to an interrogator 103 to provide distributed fibre optic sensor, e.g. arranged as a DAS sensor. The first fibre optic cable structure 102 is arranged to provide a sensitivity that varies with pressure and for example may have the form illustrated in FIG. 2 or FIG. 4. The first fibre optic cable structure is deployed in an area of interest, which in this example is a conduit 601 filled with a fluid 602. For example one application where a measure of absolute pressure may be of interest may be in a wellbore, and thus conduit 601 could be a wellbore or some casing or tubing within a wellbore.

In use the first sensing fibre 101 is interrogated by interrogator 103 to determine disturbances such as pressure waves acting on the various sensing portions of the sensing first sensing fibre 101. FIG. 6 illustrates for example a first sensing portion 603 and a second sensing portion 604. It will of course be appreciated that FIG. 6 just illustrates the principles of operation and in practice there could be many more sensing portions which could be contiguous. It will be also appreciated that FIG. 6 is not intended to convey any sense of scale.

FIG. 6 shows that a pressure variation of a first magnitude ΔP1 occurs at the location of the first sensing portion 603 and a pressure variation of a second magnitude ΔP2 occurs at the location of the second sensing portion 604. FIG. 6 also illustrates that the absolute ambient pressure at the location of the first sensing portion 603 may be a first pressure AP1 and the absolute ambient pressure at the location of the second sensing portion 604 may be a value AP2, which may be different to AP1. For example AP2 may be greater than AP1.

The sensitivity of the DAS sensor utilizing the first sensing fibre 101 will vary with the ambient pressure as discussed above. In the embodiment of FIG. 6 a second sensing optical fibre 605 is deployed to run generally along the path of the first sensing fibre 101 and the second sensing fibre is also interrogated to provide distributed fibre optic sensing. The second sensing fibre 605 is arranged so that, when used as a DAS sensor, the sensitivity of the DAS sensor does not vary substantially with absolute pressure. The second sensing fibre could, for example be deployed in a second fibre optic cable that comprises conventional buffer, core and jacket layers without any strain transformer and thus provides a transfer function between incident pressure variation and strain on the optical fibre that is largely independent on the value of absolute pressure (at least within an operating range of pressure of interest). In other words the response of a DAS sensor using the second sensing fibre 605 to incident pressure variations will vary with the magnitude of the pressure variation but will not substantially vary with absolute pressure.

The interrogator 103 is thus configured to interrogate both the first and second sensing fibres 101 and 605 to provide distributed fibre optic sensing, e.g. DAS. In some embodiments the interrogator could interrogate the sensing fibres 101 and 605 in a multiplexed fashion and thus at least some components of the interrogator, e.g. optical source or modulator for example, may be used in interrogating both sensing fibres. In other arrangements there may be separate interrogators 103a and 103b dedicated for each sensing fibre. Advantageously however the sensing fibres are interrogated in substantially the same way to provide the same distribution of sensing portions along the length of the two sensing fibres 101 and 605. In this way each of the first and second sensing portions 603 and 604 of the first sensing fibre 101 may be effectively collocated with corresponding sensing portions of the second sensing fibre 605.

The pressure variation ΔP1 will thus occur at the location of a first sensing portion 603 for each of the first and second sensing fibres 101 and 605. This will result in a detectable measurement signal from the relevant first sensing portions of each sensing fibre. The magnitude of the variation of measurement signal may be detected for each of the sensing fibres. Plot 606 illustrates the principle of how the output signal from the relevant sensing portions of the two DAS sensors. The solid line illustrates how the signal from the sensing portion of the first sensing fibre 101 may vary and illustrates a magnitude $S_{1\text{-}101}$. The dashed line illustrates how the signal from the sensing portion of the second sensing fibre 605 may vary and illustrates a magnitude $S_{1\text{-}605}$. As discussed above the magnitude of the signal from the second sensing fibre 605 will be expected to vary with the magnitude of the stimulus ΔP1 but will not vary with absolute pressure. The magnitude $S_{1\text{-}605}$ of the signal from the second sensing fibre 605 is thus indicative of the magnitude of the stimulus ΔP1. The magnitude of the signal from the first sensing fibre 101 will depend on the magnitude of the stimulus ΔP1 but also on the absolute pressure AP1 at this location.

Likewise the pressure variation ΔP2 will thus occur at the location of a first sensing portion 604 for each of the first and second sensing fibres 101 and 605. Again this will result in a detectable measurement signal from the relevant second sensing portions of each sensing fibre as illustrated in plot 607. Again the solid line illustrates how the signal from the second sensing portion of the first sensing fibre 101 may vary and illustrates a magnitude $S_{2\text{-}101}$. The dashed line illustrates how the signal from the second sensing portion of the second sensing fibre 605 may vary and illustrates a magnitude $S_{2\text{-}605}$.

Plot 607 illustrates that the magnitude $S_{2\text{-}605}$ of the response from the second sensing portion of the sensing fibre 605 is lower than the magnitude $S_{1\text{-}605}$ of the response from the first sensing portion. Given that the response of the second sensing fibre 605 is largely independent of absolute pressure, this implies that the magnitude ΔP2 of the stimulus affecting the second sensing portion 604 is lower than the magnitude ΔP1 of the stimulus affecting the first sensing portion 603. The magnitude $S_{2\text{-}101}$ of the response from the second sensing portion of the first sensing fibre 101 is also lower than the magnitude of the response from the first sensing portion. Part of this will be due to the lower magnitude of stimulus ΔP2. However it can be seen that the ratio of the magnitudes of the responses from the first sensing fibre and second sensing fibres is much lower for the second sensing portion than the first sensing portion. This indicates that the sensitivity of the first sensing fibre 101 is lower at the second sensing portion 604 than the first sensing portion 603 and thus indicates that the absolute pressure AP2 at the second sensing portion is greater than the absolute pressure AP1 at the first sensing portion 603.

Figure 7:
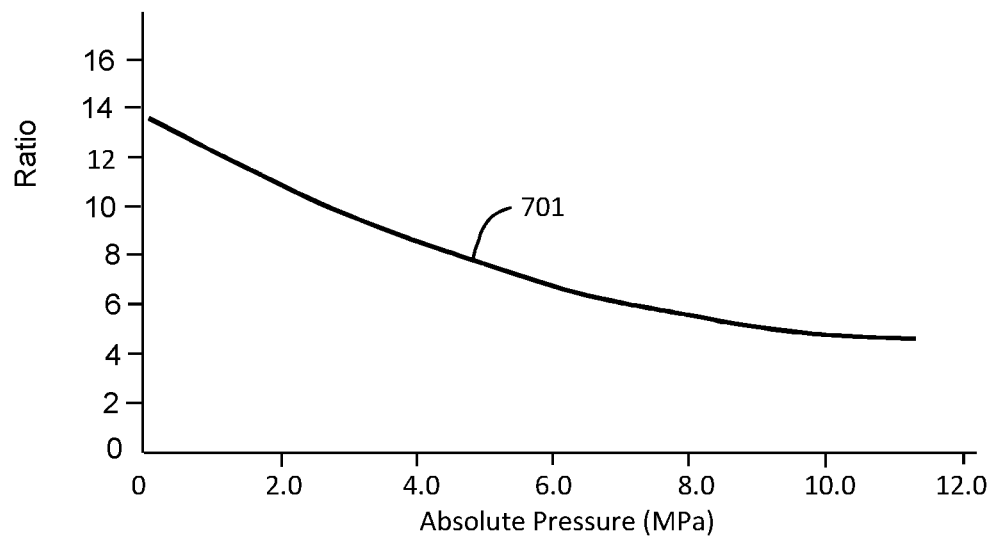
FIG. 7 illustrates a plot of how the ratio between measurement signals from a fibre optical cable structure as illustrated in FIG. 4 and a conventional fibre optic cable may vary with pressure.

FIG. 7 illustrates a one example of a plot of ratio of the measurement signal that would be expected from the first and second sensing fibres and how it varies with pressure. A first sensing fibre within a fibre optic cable structure such as illustrated in FIG. 4 was tested as described above in relation to FIGS. 5*a* and 5*b* to determine the measurement signal that would be expected for a given pressure stimulus and how it varies with pressure. The measurement signal for a standard fibre optic cable was also determined to provide the plot 701 of FIG. 7. It can be seen that the presence of the strain transformer in the fibre optic cable structure means that the first sensing fibre is more sensitive generally that the second sensing fibre. However the changing sensitivity with pressure for the first sensing fibre means that value of the ratio changes with absolute pressure as shown.

Thus by determining the response of the first and second sensing fibres 101 and 605 to the same stimuli, information about the absolute pressure around the first fibre optic cable structure 102 can be determined. A signal processor 104 may thus receive the measurement signals from the interrogator 103 for the first and second sensing optical fibres 101 and 605 and determine a ratio for the measurement signals for at least one sensing portion. In order to give a value of the absolute pressure a sensitivity profile of a DAS sensor using the first fibre optic cable structure may have been determined as discussed above, except in this case the sensitivity profile may be an indication of the relative sensitivity of a DAS sensor using such a cable compared to a DAS sensor using the second sensing optical fibre, i.e. using the relevant cable structure for the second sensing optical fibre. The sensitivity profile could for instance be an indication of how the ratio will change with pressure, i.e. the plot 701. The processor 104 may use the determined ratio value and the sensitivity profile to provide an indication of the absolute pressure at one or more sensing portions.

Whilst the second sensing optical fibre may advantageously be arranged to have substantially no variation in sensitivity with absolute pressure, in some arrangements each of the first and second sensing fibres may have a sensitivity that varies with pressure where the variation with absolute pressure is different for each of the first and second sensing fibres. This may also ensure that ratio between the detected signal magnitudes of any input signal depends on the value of absolute pressure in a known way and may allow both sensing fibres to be sensitised to transverse stimuli.

As mentioned the second sensing fibre may be formed as part of a second fibre optic cable that may be conventional fibre optic cable without a strain transformer. The second fibre optic cable may be coupled to, e.g. bound to, the first fibre optic cable structure at one or more points. In some instances the first sensing fibre and second sensing fibre may be contained within the same fibre optic cable structure. Thus, for example a first optical fibre surrounded by a compliant core with a strain transformer such as illustrated in FIG. 2 or FIG. 4 may be arranged to run alongside a second fibre optic, possibly surrounded by a compliant core and both housed within one or more further layers, such as a jacket layer. The strain transformer will be arranged to transform transverse strains into longitudinal strains acting on the first optical fibre, but not the second optical fibre.

Additionally or alternatively the first optical fibre may be optically coupled to the second optical fibre so that optical radiation can pass from one fibre to the other. In this way the two sensing fibre can be interrogated by a single interrogator. If the first sensing fibre were connected to the interrogator at one end and the second sensing fibre at its other end, the interrogator would in effect see a first set of sensing portions corresponding to the first sensing fibre and a second set of sensing portions corresponding to the second sensing fibre. For example as illustrated in FIG. 6 the first and second optical fibres 101 and 605 could be spliced together at the bottom end and one of the fibres interrogated from the top end by the interrogator 103. In some embodiments, rather than splice two separate optical fibres, the fibre optic cable structure may be manufactured so that a force transformer is deployed along a first length of the cable and a second length of the cable is free from the strain transformer. In such a case the first sensing fibre and second sensing fibre may comprise different parts of the same sensing fibre, i.e. there may be a first length of sensing fibre that exhibits a sensitivity that varies with pressure and a second length of the same sensing fibre that has a sensitivity that is substantially constant with absolute pressure.

In some instances the sensitivity of a DAS sensor using a sensing fibre in a fibre optic cable structure may also depend on the ambient temperature of the fibre optic cable structure. In some embodiments therefore it may also be advantageous to determine the ambient temperature of the fibre optic cable. This could, in some embodiments, be performed by fibre optic distributed temperature sensing (DTS). DTS is a different type of fibre optic sensing that can provide an indication of the temperature of an optical fibre along its length. Conventional DTS is a different type of fibre optic sensing to Rayleigh based DAS.

FIG. 6 thus illustrates that in some embodiments there may be a DTS interrogator 608 arranged to perform DTS on a sensing fibre deployed along the length of the first fibre optic cable structure 102. FIG. 6 illustrates that there may be a separate optical fibre 609 for DTS and in applications to well monitoring there may well be a DTS sensor provided for temperature monitoring in any case. However in some applications one of the first or second optical fibres 101 or 605 could be used for both DAS and DTS in a multiplexed fashion.

The sensitivity profile for the first and/or second sensing optical fibres could thus also be characterised for different temperatures and the processor 104 may also receive an indication of temperature from the DTS sensor.

The response of the strain transformer and compliant core material to a given transverse strain may be adapted for the particular application in which the DAS sensor may be employed and in particular the first fibre optic cable structure may be designed to maximise the change in sensitivity over a desired pressure range.

Embodiments of the present disclosure thus relate to distributed fibre optic sensors that can provide an indication of the absolute pressure along the length of a sensing optical fibre with good accuracy and high dynamic range.

A fibre optic cable structure 102 as described above may be manufactured in various ways. For example one method may involve initially producing one or more optical fibres in a tight buffered configuration in a core material such as extruded nylon using various conventional fabrication techniques before winding a suitable material such as a steel wire around the core material using known winding techniques. The core material with surrounding helically coiled member may then be encapsulated in one or more outer jacket materials using known manufacturing techniques. As mentioned above the outer jacket is arranged to apply any external pressure to the coiled member, but to substantially avoid applying pressure directly to the compliant core. The overall cable structure should preferably be stiff enough to install without too much stretch of the cable, which could potentially result in damage to the optical fibre(s). In some embodiments a strength member may be incorporated in the fibre optic cable to limit the overall extent of longitudinal extension of the fibre to prevent damage to the cable, and in particular to the optical fibre, during handling and installation where relatively high longitudinal forces may be experienced. Additionally or alternatively a pull cord or other apparatus for limiting the extension of the cable may be attached to or formed within the cable structure.

FIG. 2 illustrates a single coiled member 205 wound in a continuous helix. It will be understood however that various other arrangements may be used. For example there may be different helical members at different parts of the fibre optic cable. It may not be possible to provide one single continuous helical coiled member for the entire length of the fibre optic cable and thus different lengths of the optical fibre may be provided with different coiled helical members. In some embodiment a given length of fibre optic cable may have more than one force transformer, e.g. more than one helical coiled member. As illustrated in FIG. 4 a braid structure may be used as the force transformer and may be formed by winding one or more members in different directions around the core material 203, e.g. clockwise and anticlockwise.

Figure 8:
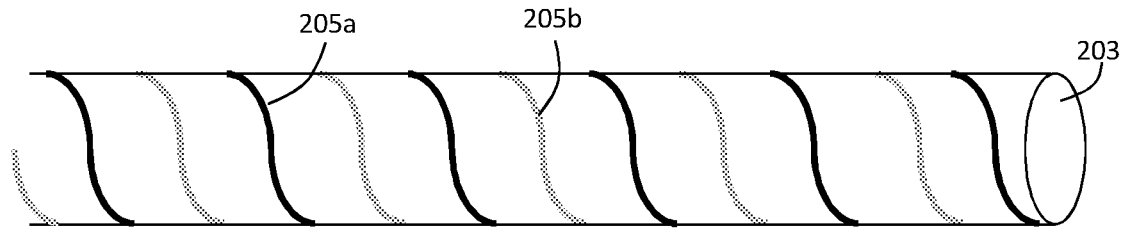
FIG. 8 illustrates a further example of a suitable fibre optic cable structure.

In some implementations one helical coiled member 304a may be interleaved with another helical coiled member 304b with winding in the same sense as illustrated in FIG. 8. As mentioned above the helix winding angle may be chosen to provide a cable with a desired response. This will therefore define the helix pitch for a given diameter of compliant core material 203.

Figure 9:
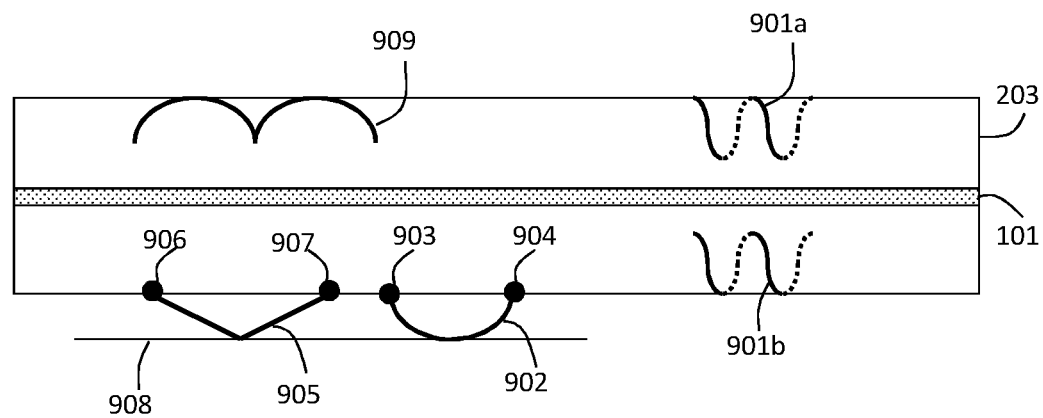
FIG. 9 illustrates further examples of possible strain transformers.

A helically wound force transformer or braid structure wound around the outside of a compliant core material has the advantages described above and can be manufactured relatively easily. However there are other designs of force transformers that could be used in some embodiments. FIG. 9 illustrates some examples.

In some embodiments one or more helical force transformers may be used that do not encircle the compliant core material 203 or even the optical fibre(s) 101. For example a helical force transformer 901a may be wound helically with respect to an axis parallel to the cable axis but arranged to one side of the optical fibre 101, for instance embedded within compliant core material 203. At least one other similar helical force transformer 901b could be arranged on the other side of the optical fibre(s) to provide an even transformation on both side of the optical fibre(s).

In some embodiments one or more force transformers with convex shapes could be anchored to the exterior of the compliant core material. For instance force transformer 902 is anchored to the compliant core material at points 903 and 904 which are longitudinally separated from one another and comprises a generally curved element extending between the anchor points, such that the overall length of the force transformer is greater than longitudinal separation. An inward radial force due to temperature variations will tend to deform the force transformer forcing the anchoring point apart. Force transformer 905 is similar and is anchored at point 906 and 907 but comprises two generally straight rods that may for example be joined at a pivot point. The exterior of the compliant core may be surrounded by several such force transformers so as to respond to radial dimension changes due to thermal effects and the force transformers may be coupled to a force plate for even force distribution.

Force transformer 909 is somewhat similar but embedded within the compliant core material 203.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. A distributed fibre optic sensor apparatus comprising:
a first fibre optic cable structure comprising a first optical fibre;
an interrogator configured to perform distributed acoustic sensing on the first optical fibre to provide a measurement signal from at least one sensing portion of the first optical fibre; and
a processor;
wherein the first fibre optic cable structure is configured such that, for said at least one sensing portion of the first optical fibre, a sensitivity of the sensing portion to an incident pressure stimulus depends on the ambient pressure acting on first fibre optic cable structure at the location of the respective sensing portion; and
wherein the processor is configured to process the measurement signal from said at least one sensing portion of the first optical fibre in response to an incident pressure stimulus based on a predetermined sensitivity profile to determine an indication of the value of the ambient pressure at the respective sensing portion.

2. The distributed fibre optic sensor apparatus as claimed in claim 1 wherein the processor is configured to process the measurement signal from said at least one sensing portion of the first optical fibre in response to an incident pressure stimulus which is a controlled stimulus of known magnitude.

3. The distributed fibre optic sensor apparatus as claimed in claim 2 wherein the predetermined sensitivity profile is an indication of the sensitivity of the respective sensing portion at one or more values of ambient pressure.

4. The distributed fibre optic sensor apparatus as claimed in claim 1 further comprising a second optical fibre deployed along the path of the first optical fibre, wherein:
the interrogator is configured to perform distributed acoustic sensing on the second optical fibre to provide a measurement signal from at least one sensing portion of the second optical fibre so that at least one sensing portion of the first optical fibre has a corresponding sensing portion of the second optical fibre at substantially the same location;
the second optical fibre is configured such that a sensitivity of the second optical fibre to an incident pressure stimulus has a relationship with ambient pressure that is different to that of the first sensing fibre; and
the processor is configured to process the measurement signal from a sensing portion of the first sensing optical fibre together with the measurement signal from the corresponding sensing portion of the second sensing optical fibre in response to the same incident pressure stimulus.

5. The distributed fibre optic sensor apparatus as claimed in claim 4 wherein the second optical fibre is configured such that the sensitivity of the second sensing optical fibre does not substantially vary with ambient pressure acting on the second optical fibre.

6. The distributed fibre optic sensor apparatus as claimed in claim 4 wherein said predetermined sensitivity profile is an indication of the relative sensitivity of the first and second sensing fibres to an input stimulus at one or more values of ambient pressure.

7. The distributed fibre optic sensor apparatus as claimed in claim 4 wherein the processor is configured to determine a ratio of magnitude of the measurement signal from a sensing portion of the first sensing fibre and the measurement signal from a corresponding sensing portion of the second sensing fibre.

8. The distributed fibre optic sensor apparatus as claimed in claim 1 further wherein the processor is configured to receive an indication of temperature at one or more locations along the length of the first fibre optical cable structure, wherein the predetermined sensitivity profile is indicative as to how sensitivity varies with temperature.

9. The distributed fibre optic sensor apparatus as claimed in claim 8 further comprising a fibre optic distributed temperature sensor configured to perform distributed temperature sensing on a temperature sensing optical fibre deployed along the path of the first fibre optic cable structure.

10. The distributed fibre optic sensor apparatus as claimed in claim 1 wherein the first fibre optic cable structure comprises at least one deformable strain transformer mechanically coupled to the first optical fibre and configured such that a force acting on the strain transformer in a direction transverse to the cable axis results in a deformation of the strain transformer thereby applying a longitudinal force to the first optical fibre.

11. The distributed fibre optic sensor apparatus as claimed in claim 10 wherein the first fibre optic cable structure comprises a compliant core material mechanically coupled to the first optical fibre such that a longitudinal force acting on the compliant core material induces a longitudinal strain in the at least one optical fibre.

12. The distributed fibre optic sensor apparatus as claimed in claim 11 wherein the strain transformer is stiffer than the compliant core material.

13. The distributed fibre optic sensor apparatus as claimed in claim 11 wherein the compliant core material comprises extruded nylon.

14. The distributed fibre optic sensor apparatus as claimed in claim 10 where the strain transformer comprises at least one helically coiled member or a braid member.

15. The distributed fibre optic sensor apparatus as claimed in claim 14 wherein the helix angle of said helically coiled member is of the order of 50 to 70 degrees and the diameter of said helically coiled member is in the range of 1 to 10 mm.

16. The distributed fibre optic sensor apparatus as claimed in claim 10 wherein at least one portion of the first fibre optic cable structure comprises a plurality of strain transformers, each strain transformer comprising a helically wound coiled member.

17. The distributed fibre optic sensor apparatus as claimed in claim 16 wherein at least one helically wound coiled member is wound in the opposite direction to another helically wound coiled member or is interleaved with another helically wound coiled member.

18. The distributed fibre optic sensor apparatus as claimed in claim 10 wherein the strain transformer comprises a shaped steel member wherein the volume percentage of steel of the fibre optic cable is substantially 10%.

19. The distributed fibre optic sensor apparatus as claimed in claim 1 wherein at least part of the first fibre optic cable structure is deployed within a fluid filled conduit and the processor is configured to determine an indication of the pressure of the fluid within the conduit.

20. A method of distributed fibre optic sensing comprising:
performing distributed acoustic sensing on a first optical fibre disposed within a first fibre optic cable structure to provide a measurement signal from at least one sensing portion of the first optical fibre;
wherein the first fibre optic cable structure is configured such that, for said at least one sensing portion of the first optical fibre, a sensitivity of the sensing portion to an incident pressure stimulus depends on the ambient pressure acting on first fibre optic cable structure at the location of the respective sensing portion;
the method comprising acquiring a measurement signal from at least one sensing portion of the first optical fibre in response to an incident pressure stimulus; and
processing said measurement signal based on a predetermined sensitivity profile to determine an indication of the value of the ambient pressure at the respective sensing portion.

* * * * *